(12) United States Patent
Cai et al.

(10) Patent No.: US 9,564,429 B2
(45) Date of Patent: Feb. 7, 2017

(54) LATERAL BIPOLAR SENSOR WITH SENSING SIGNAL AMPLIFICATION

(71) Applicant: International Business Machines Corporation, Armonk, NY (US)

(72) Inventors: Jin Cai, Cortlandt Manor, NY (US); Tak H. Ning, Yorktown Heights, NY (US); Jeng-Bang Yau, Yorktown Heights, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/751,101

(22) Filed: Jun. 25, 2015

(65) Prior Publication Data
US 2016/0379975 A1 Dec. 29, 2016

(51) Int. Cl.
| | |
|---|---|
| *H01L 29/66* | (2006.01) |
| *H01L 27/082* | (2006.01) |
| *H01L 29/735* | (2006.01) |
| *H01L 29/10* | (2006.01) |
| *H01L 29/161* | (2006.01) |
| *H01L 29/737* | (2006.01) |
| *H01L 29/06* | (2006.01) |
| *H01L 23/31* | (2006.01) |

(Continued)

(52) U.S. Cl.
CPC .............. *H01L 27/082* (2013.01); *G01T 1/026* (2013.01); *H01L 21/8222* (2013.01); *H01L 23/3171* (2013.01); *H01L 29/0653* (2013.01); *H01L 29/1008* (2013.01); *H01L 29/161* (2013.01); *H01L 29/6625* (2013.01); *H01L 29/66242* (2013.01); *H01L 29/735* (2013.01); *H01L 29/737* (2013.01)

(58) Field of Classification Search
CPC .............. H01L 27/082; H01L 21/8222; H01L 29/0653; H01L 29/1008; H01L 29/161; H01L 29/66242; H01L 29/6625; H01L 29/735; H01L 29/737; H01L 23/3171; G01T 1/026
See application file for complete search history.

(56) References Cited

U.S. PATENT DOCUMENTS

| | | |
|---|---|---|
| 6,028,472 A | 2/2000 | Nagumo |
| 6,670,656 B1 | 12/2003 | Lai et al. |
| 6,888,770 B2 | 5/2005 | Ikehashi |

(Continued)

FOREIGN PATENT DOCUMENTS

KR 101128855 B1 3/2012

OTHER PUBLICATIONS

English language translation of Korean Publication KR101128855.

*Primary Examiner* — Shaun Campbell
(74) *Attorney, Agent, or Firm* — Louis J. Percello, Esq.; Otterstedt, Ellenbogen & Kammer, LLP (57) ABSTRACT

An integrated sensor for detecting the presence of an environmental material and/or condition includes a sensing structure and first and second bipolar junction transistors (BJTs). The first BJT has a base that is electrically coupled with the sensing structure and is configured to generate an output signal indicative of a change in stored charge in the sensing structure. The second BJT is configured to amplify the output signal of the first bipolar junction transistor. The first and second BJTs and the sensing structure are monolithically formed a common substrate.

18 Claims, 8 Drawing Sheets

(51) Int. Cl.
*H01L 21/8222* (2006.01)
*G01T 1/02* (2006.01)

(56) References Cited

U.S. PATENT DOCUMENTS

| | | | |
|---|---|---|---|
| 8,283,736 B2 | 10/2012 | Kang et al. | |
| 2004/0223392 A1 | 11/2004 | Ikehashi | |
| 2012/0138460 A1* | 6/2012 | Baghbani-Parizi | B82Y 15/00 204/450 |
| 2013/0084816 A1* | 4/2013 | Gomez | H04B 1/0475 455/127.2 |
| 2013/0325391 A1 | 12/2013 | Kwon et al. | |
| 2014/0027871 A1* | 1/2014 | Cai | H01L 31/115 257/431 |
| 2014/0030819 A1* | 1/2014 | Rajagopal | H01L 29/73 436/501 |
| 2015/0097214 A1* | 4/2015 | Chen | G01N 27/4145 257/253 |

\* cited by examiner

LATERAL BIPOLAR SENSOR WITH SENSING SIGNAL AMPLIFICATION

BACKGROUND OF THE INVENTION

The present invention relates generally to the electrical, electronic and computer arts, and, more particularly, to integrated sensors.

Advancements in microelectronics have facilitated the introduction of numerous applications that improve the quality of life and benefit society in immeasurable ways. In addition to mainstream applications in conventional consumer electronics, microelectronics can be utilized in seemingly remote areas of the population. Given the ever-increasing globalization of society, precise acquisition, (near) real-time processing and analyses of tremendous amounts of information are in high demand. One example is the use of sensors that can detect and provide relevant environmental information, such as, but not limited to, radiation levels, inorganic particles, biological entities, etc., to ensure safety, security, and stability of environmental control. In addition, with advancements in mobile technology, technological benefits have been achieved by integrating such sensors into personal devices to provide real-time and customized readout of information.

Conventionally, different types of sensors are fabricated for the detection of corresponding different types of materials/substances. For example, Geiger counters are used to detect radiation dose, using ionization produced in a Geiger-Müller tube, and provide a real-time and semi-quantitative readout. However, Geiger counters have limited success in measuring high radiation rates and in measuring the energy of incident radiation. Personal radiation dosimeters in the form of wearable badges and the like are available but cannot provide a real-time indication of radiation; rather, such personal radiation dosimeters provide an indication of accumulated radiation or total radiation dose received. Biosensors, which often combine a biological component with a physicochemical detector, depending on the type of material to be detected, often require a certain amount of time for readout due to the reaction/detection mechanism. Moreover, better resolution/sensitivity requires longer processing time, which sometimes involves special instruments only available in laboratories, thus limiting the portability of biosensors.

BRIEF SUMMARY

Principles of the invention, in accordance with one or more embodiments thereof, provide techniques for forming to a monolithic sensor for detecting the presence of an environmental material and/or condition, and methods for making said sensor, which includes the capability of sensing signal amplification.

In one aspect, an exemplary integrated sensor includes a sensing structure and first and second bipolar junction transistors (BJTs). The first BJT has a base that is electrically coupled with the sensing structure and is configured to generate an output signal indicative of a change in stored charge in the sensing structure. The second BJT is configured to amplify the output signal of the first bipolar junction transistor. The first and second BJTs and the sensing structure are monolithically formed a common substrate.

In another aspect, an exemplary method for detecting the presence of an environmental material and/or condition includes the steps of: forming a sensing structure; forming a first bipolar junction transistor having a base that is electrically coupled with the sensing structure, the first bipolar junction transistor being configured to generate an output signal indicative of a change in stored charge in the sensing structure resulting from the presence of at least one of said environmental material and said environmental condition; and forming a second bipolar junction transistor configured to amplify the output signal of the first bipolar junction transistor, the first and second bipolar junction transistors being formed adjacent to one another on a common substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages:

- ideal 60 millivolt per decade of collector current vs. base-emitter voltage ($I_C$-$V_{BE}$) characteristics;
- no requirement of thin buried oxide layer (e.g., less than 40 nanometers (nm)), as in conventional sensor devices;
- the sensing/detection layer of the sensor can be readily custom engineered for a given application (e.g., radiation, biological, chemical, etc.);
- superior charge retention rendered by using oxide as a sensing layer;
- amplification of the sensing signal with gains that can be controlled via material/device engineering.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of an illustrative silicon-based sensor that includes a detector fabricated on a unique inverted lateral bipolar junction transistor (BJT) structure which utilizes a charge detection mechanism. The sensor further includes an amplifier monolithically integrated with the detector on a common substrate using complementary metal-oxide-semiconductor (CMOS)-compatible processes. It is to be appreciated, however, that the invention is not limited to the specific apparatus and/or methods illustratively shown and described herein. Rather, aspects of the present disclosure relate more broadly to a monolithic sensor apparatus, and methods for making said apparatus, which includes the capability of sensing signal amplification. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

A silicon-based radiation dosimeter built on a fully-depleted silicon-on-insulator (FDSOI) metal-oxide-semiconductor field-effect transistor (MOSFET) structure provides a very cost-effective sensor using existing wafer fabrication technology that can be embedded in mobile devices, such as, for example, cell phones, global positioning system (GPS) devices, iPod and MP3 devices, etc., or even built into credit cards, drivers licenses, and the like. The mechanism of radiation detection in FDSOI MOSFET dosimeters relies on sensing linear changes in the sub-threshold characteristics (e.g., threshold voltage, $V_T$) of a MOSFET device caused by radiation-generated charges that are trapped in a buried oxide (BOX) layer of the MOSFET device. However, certain limitations and/or drawbacks exist for FDSOI MOSFET dosimeters, such as, but not limited to:

- a relatively thin (e.g., less than 40 nanometers (nm)) SOI structure needed to allow the BOX charges to sufficiently affect the threshold voltage of the front gate to maintain high dosimetric sensitivity, and to make the SOI fully depleted (which can result in a potential contact resistance penalty);
- the sub-threshold slope of drain current vs. gate voltage ($I_D$-$V_G$) characteristics for a MOSFET is usually greater than 60 millivolts per decade (mV/dec);
- the sub-threshold characteristics of the FDSOI MOSFET detector may deviate from a linear dependence of radiation dose at extremely high dosages; and
- the sensing signal is obtained directly from the transfer characteristics (current-voltage) of the detector, which is subject to interference attributable to noise (among other factors) when the sensing signal is small due to a limited quantity of detectable substances or device degradation.

Aspects of the invention advantageously eliminate or reduce one or more of the above-noted disadvantages of sensors based on an FDSOI MOSFET structure. One or more embodiments of the invention provide a sensor which comprises a detector based on a novel inverted lateral BJT structure. Furthermore, the sensor includes an amplifier monolithically integrated with the detector on a common substrate for providing sensing signal amplification. A sensor fabricated in accordance with aspects of the invention can be configured as an efficient detector of one or more environmental properties, including, but not limited to, radiation, biological and chemical entities, through appropriate structure and/or material engineering. In one or more embodiments, the sensor, which utilizes a charge detection mechanism, offers at least one of the following advantages over its FDSOI MOSFET counterparts:

- ideal 60 mV/dec of collector current vs. base-emitter voltage ($I_C$-$V_{BE}$) characteristics, compared to greater than 60 mV/dec of $I_D$-$V_{GS}$ characteristics for an FDSOI MOSFET;
- no requirement of thin silicon layer (e.g., less than 40 nm);
- the sensing/detection layer of the sensor can be readily custom engineered for a given application (e.g., radiation, biological, chemical, etc.);
- superior charge retention rendered by using oxide as the sensing layer;
- amplification of the sensing signal with gains that can be controlled via material/device engineering.

Figure 1:
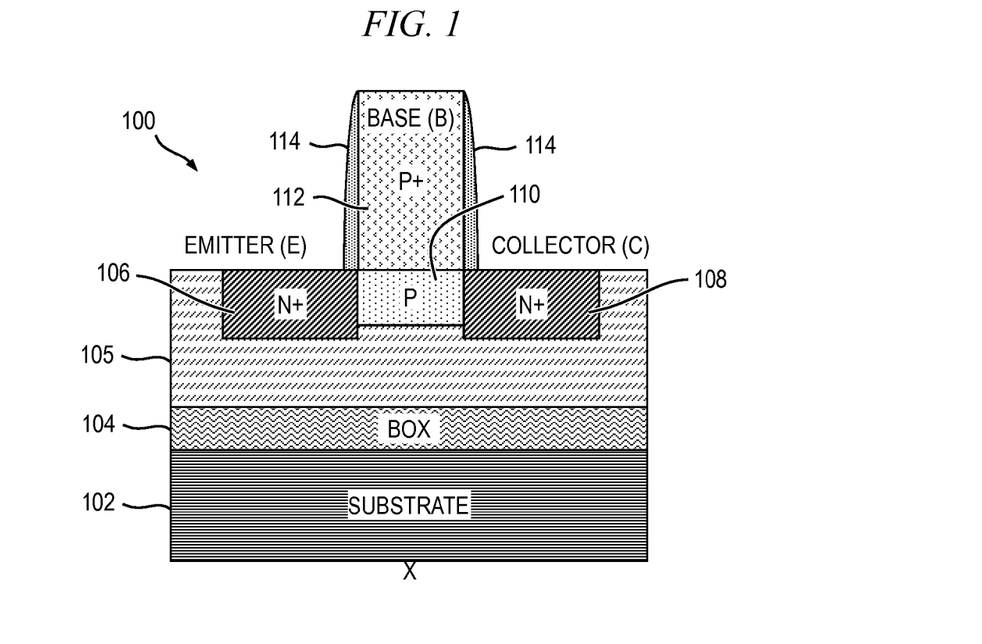
FIG. 1 is a cross-sectional view depicting at least a portion of an exemplary charge sensing lateral silicon-on-insulator (SOI) bipolar junction transistor (BJT)

FIG. 1 is a cross-sectional view depicting at least a portion of an exemplary charge sensing lateral SOI BJT 100. The lateral SOI BJT 100 includes a substrate 102 on which a buried oxide (BOX) layer 104 is formed. A silicon layer 105, which may be referred to herein as an SOI layer, is formed on at least a portion of an upper surface of the BOX layer 104. Laterally-spaced regions 106 and 108 of n+ conductivity type formed in the SOI layer 105, proximate an upper surface of the SOI layer, form an emitter (E) and a collector (C), respectively, of the SOI BJT device. A region 110 of p-type conductivity is formed in the upper surface of the SOI layer 105 between the regions 106 and 108. The P region 110, which essentially forms an intrinsic base (B) of the SOI BJT device, is laterally adjacent to the n+ regions 106, 108 thereby forming respective base-emitter and base-collector p-n junctions.

An extrinsic base of the SOI BJT 100 includes a p+ conductivity structure 112 formed on and electrically contacting at least a portion of an upper surface of the intrinsic base region 110. In the illustrated example, the extrinsic base structure 112 has a higher doping concentration compared to the intrinsic base 110. The extrinsic base structure 112 is self-aligned with the intrinsic base region 110, thus lowering base resistance. The extrinsic base structure 112 is electrically shielded from adjacent emitter and collector terminals/contacts (not explicitly shown, but implied) by insulating spacers 114 formed on sidewalls of the extrinsic base structure. In the exemplary SOI BJT 100, the emitter-base junction is forward-biased and the collector-base junction is zero or reverse-biased for proper functioning of the BJT device. In this embodiment, the emitter and collector are formed of n-type conductivity material while the base is formed of p-type conductivity material, and therefore the SOI BJT 100 may be considered an NPN device. In other embodiments, the emitter and collector may be formed of a p-type conductivity material and the base formed of an n-type conductivity material, thereby resulting in a PNP BJT device.

Figure 2:
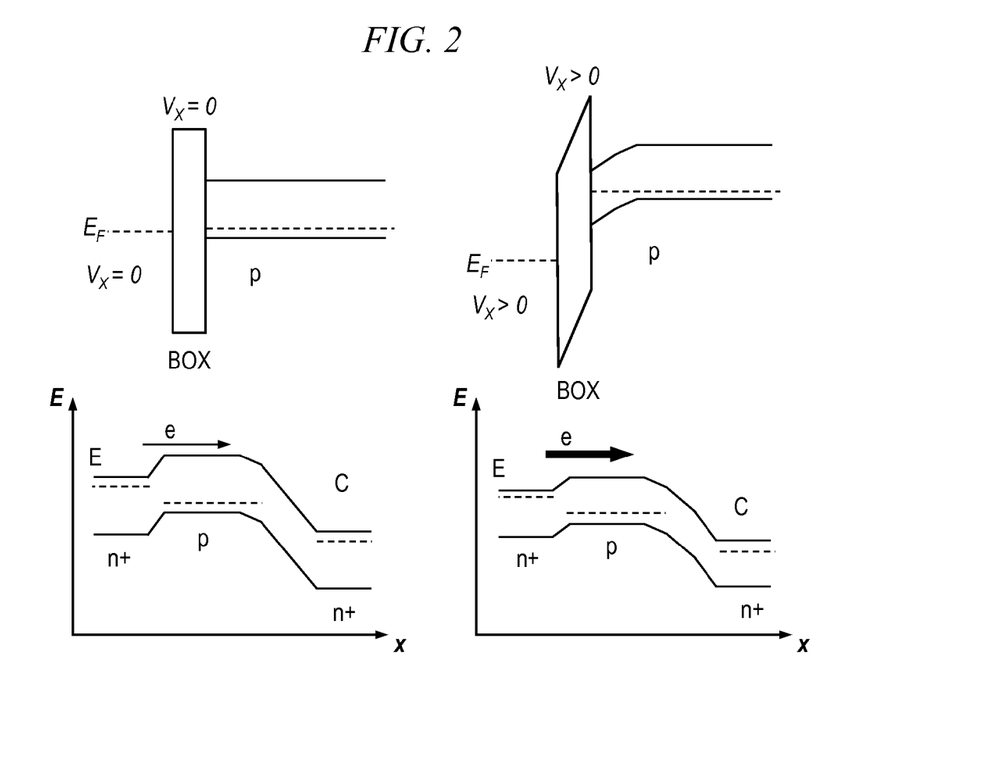
FIG. 2 conceptually depicts illustrative energy band diagrams corresponding to the exemplary lateral SOI BJT device shown in FIG. 1, with an applied substrate bias voltage and without.

FIG. 2 conceptually depicts illustrative energy band diagrams corresponding to the lateral SOI BJT device 100 shown in FIG. 1, both with an applied forward bias to the substrate, $V_X$, (i.e., $V_X>0$) and without (i.e., $V_X=0$). Biasing the substrate ($V_X>0$) causes depletion of the p-base region 110 near the BOX layer 104; this is shown in top and bottom panes on the right-hand side of FIG. 2. Positive charges generated by ionizing radiation and trapped in the BOX layer 104 have an equivalent effect of a positive substrate bias $V_X$ on the electric field distribution. FIG. 2 illustrates the effect of positive charges on lowering an energy barrier in the intrinsic base region (110 in FIG. 1), leading to an enhanced output of collector current, which is used to gauge radiation dose, in the context of a radiation sensing application. The same mechanism applies to the case when the oxide layer is on top of the base region of an inverted lateral BJT, which could be built on both SOI and bulk silicon substrates.

Figure 3:
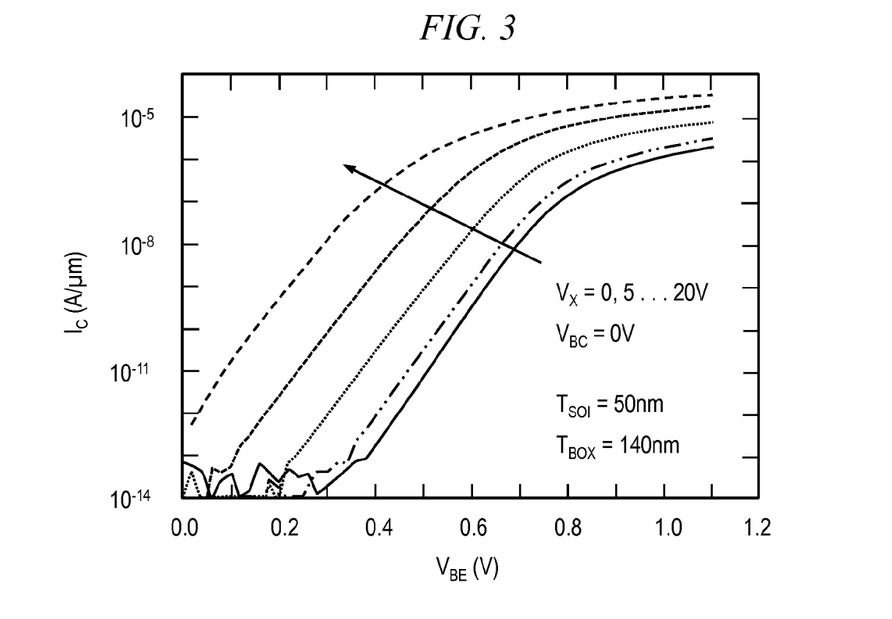
FIGS. 3 and 4 are graphs conceptually depicting exemplary effects on collector current ($I_C$) and base current ($I_B$), respectively, as a function of substrate bias.
Figure 4:
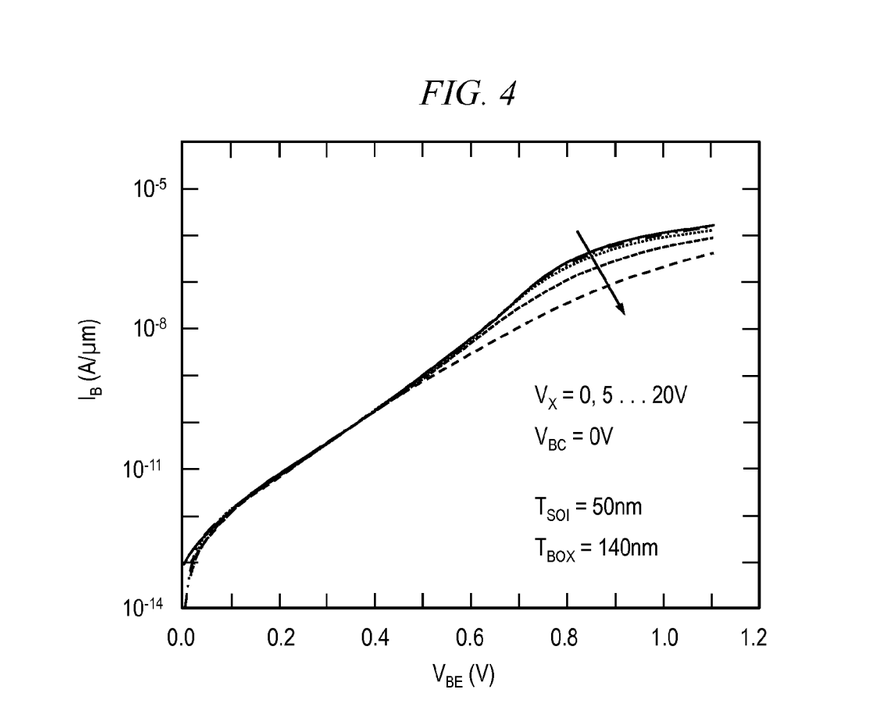

FIGS. 3 and 4 are graphs which conceptually depict exemplary effects on collector current ($I_C$) and base current ($I_B$), respectively, as a function of substrate bias $V_X$. In this illustrative scenario, it is assumed that the SOI BJT device has an SOI thickness ($T_{SOI}$) of 50 nm and a BOX thickness ($T_{BOX}$) of 140 nm, although it is to be understood that these dimensions are merely non-limiting examples. Furthermore, it is assumed that the base-to-collector voltage of the device, $V_{BC}$, is zero. With reference to FIG. 3, it is apparent that collector current $I_C$ increases rather rapidly as a function of increasing bias voltage $V_X$ (e.g., from 0 to 20 volts). For example, at a base-emitter voltage, $V_{BE}$, of 0.4 V, $I_C$ increases from about $10^{-13}$ A per micron at $V_X=0$ V, to about $10^{-7}$ A per micron at $V_X=20$ V. In FIG. 4, it is apparent that base current $I_B$ decreases very slowly as a function of increasing bias voltage $V_X$. For example, at $V_{BE}$ of 0.4 V, $I_B$ changes very little between $V_X=0$ V and $V_X=20$ V. Since current gain in the BJT device is determined, to at least a first order, as collector current divided by base current, $I_C/I_B$, it is evident that current gain increases rather rapidly with increasing bias voltage $V_X$. Similar to an FDSOI MOSFET-based dosimeter, BOX charges generated by ionizing radiation can achieve comparable modulation of collector and base currents in the lateral SOI BJT device.

Figure 5:
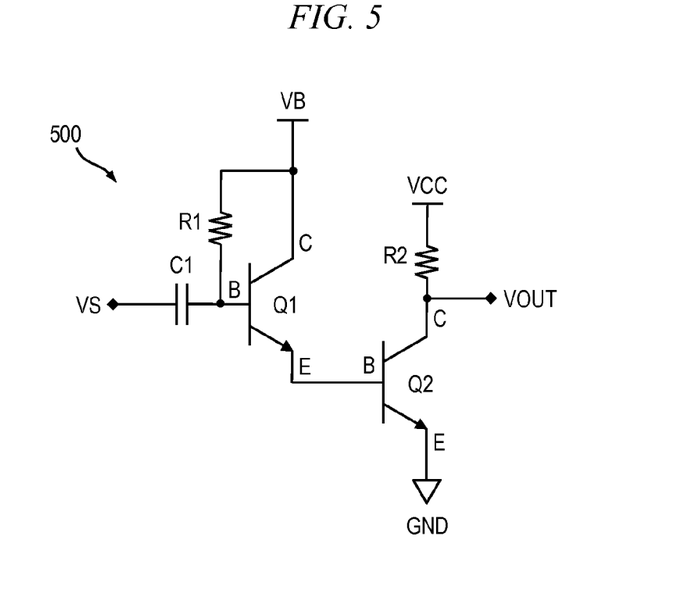
FIG. 5 is an electrical schematic diagram depicting at least a portion of an exemplary sensor circuit with sensing signal amplification, according to an embodiment of the invention.

With reference now to FIG. 5, an electrical schematic diagram depicts at least a portion of an exemplary sensor circuit 500, according to an embodiment of the invention. The sensor circuit 500 includes a first NPN BJT, Q1, configured as a sensing device, and a second NPN BJT, Q2, configured as an amplifying device. A base of transistor Q1 is configured to receive an input sense signal, VS, via a series-coupled capacitor, C1. Specifically, the base of Q1 is connected with a first terminal of a capacitor C1 and a second terminal of C1 is adapted to receive sensing signal VS. The base of transistor Q1 is also connected with a bias source, VB, through a first resistor, R1. A collector of transistor Q1 is connected with the bias source VB. The bias source VB, in conjunction with a value of resistor R1, sets the quiescent base voltage of transistor Q1. The capacitor C1 serves to couple the sensing signal VS to the base of the sensing bipolar transistor Q1. The value of C1 is determined as a function of the thickness of the sensor insulator covering the intrinsic base of transistor Q1. The thickness of the sensor insulator is preferably between about 3 nm and 30 nm, although embodiments of the invention are not limited to any particular dimensions of the sensor insulator.

An emitter of transistor Q1 is connected with a base of transistor Q2. An emitter of transistor Q2 is connected to a first supply voltage source, which is an electrical ground, GND (i.e., zero volt), in this embodiment. A collector of transistor Q2 is connected with a second supply voltage source, which is VCC in this embodiment, through a second resistor, R2. An amplified sense signal, VOUT, is generated as an output of the sensor circuit 500 at the collector of transistor Q2. Values for R1 and R2 are typically between about 1 kΩ and 10 kΩ, although embodiments of the invention are not limited to any particular resistance values for R1 and R2.

In terms of operation of sensor circuit 500, when sensing an environmental condition or other detectable factor (e.g., radiation, biological or chemical entity, etc.), the sense signal VS induces a slight change in the surface potential in the base region of transistor Q1, which in turn causes a change in the emitter current in Q1. This change in emitter current in transistor Q1 is amplified by transistor Q2 by a factor of β, the current gain of Q2. For a homojunction bipolar transistor device, β is about 50, while for a heterojunction bipolar transistor device (which typically uses differing semiconductor materials for the base and emitter regions), β can be about 5000 or larger; typically, the emitter comprises a larger bandgap material than the base in a heterojunction bipolar device.

As previously stated, the sense signal generated by a sensor is conventionally very small in amplitude and is therefore highly susceptible to noise and other signal corruption factors. A sensor according to one or more embodiments of the invention, however, provides an amplified sense signal as an output thereof and is thereby able to beneficially achieve a superior signal-to-noise ratio (SNR) compared to standard sensors.

By way of example only and without limitation, FIGS. 6-15 are cross-sectional views depicting exemplary processing steps/stages in the fabrication of a sensor, comprising NPN BJTs, according to an embodiment of the invention. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 6:
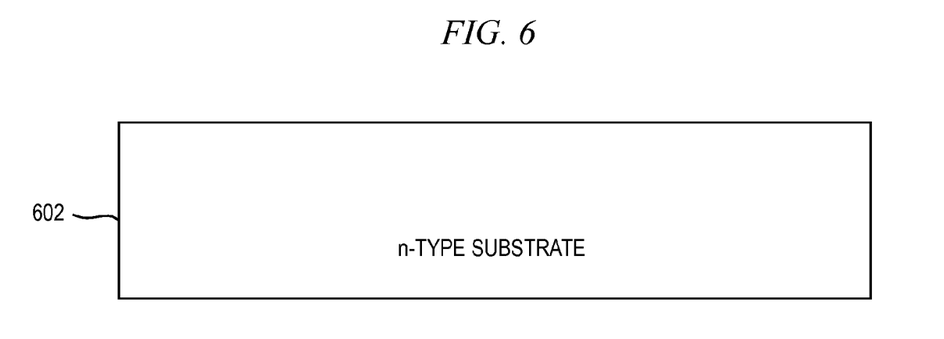
FIGS. 6-15 are cross-sectional views depicting exemplary steps/stages in the fabrication of a monolithic sensor with sensing signal amplification, according to an embodiment of the invention.

The sensor fabrication method begins in FIG. 6 with the formation of a substrate 602. The substrate 602 is commonly formed of single-crystal silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate is preferably modified by adding an impurity or dopant (e.g., boron, phosphorous, arsenic, etc.) to change a conductivity of the material (e.g., n-type or p-type). In one or more embodiments, the substrate 602 is of n-type conductivity and may thus be referred to as an n− substrate. An n− substrate may be formed by adding an n-type impurity or dopant (e.g., Group V elements, such as phosphorous) of a prescribed concentration level (e.g., about $1 \times 10^{15}$ about $1 \times 10^{17}$ atoms per cubic centimeter) to the substrate material, such as by using a diffusion or implant step, to change the conductivity of the material as desired. In one or more alternative embodiments, a p− substrate may be formed by adding a p-type impurity or dopant (e.g., Group III elements, such as boron) of a prescribed concentration level to the substrate material.

Figure 7:
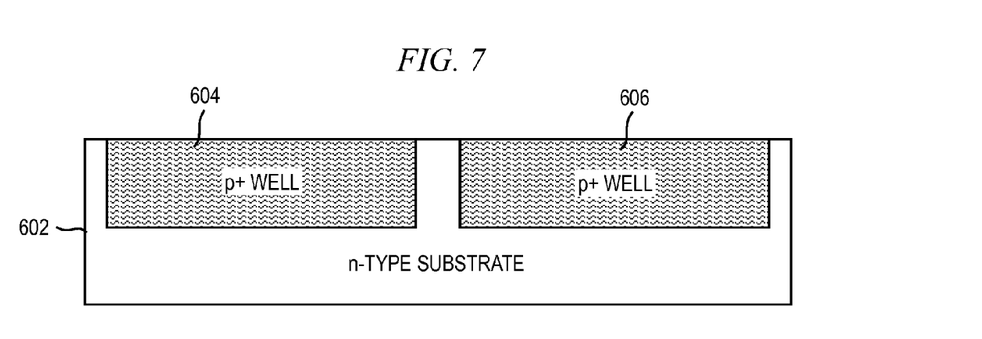

Next, first and second heavily doped p+ wells 604 and 606, respectively, are formed in the substrate 602, as shown in FIG. 7. The wells 604 and 606, which can be formed using diffusion, for example, are positioned proximate an upper surface of the substrate 602 and spaced lateral from one another. A p+ well may be formed by using a mask (e.g., photoresist layer) to define a well region in the substrate 602, implanting a p-type impurity or dopant (e.g., boron) of a prescribed concentration level into the defined well region, and then performing a high-temperature anneal to drive the implanted impurity into the defined region of the substrate and thereby form the p+ well. The doping concentration of the p+ wells are higher than the doping concentration of the n− substrate. In other words, a p+ well is formed by counter-doping a region of the n− substrate, thereby turning the region from n-type into p-type conductivity. A depth of the p+ well in the substrate may be controlled as a function of the impurity doping concentration, the temperature and/or duration of the anneal. The p+ wells 604 and 606 will form extrinsic bases of adjacent inverted lateral NPN BJT devices formed on the common substrate 602 of the sensor.

It is to be appreciated that when a p− substrate is employed, the wells 604 and 606 forming the extrinsic bases of the lateral BJT devices will be n+ wells. N+ wells can be formed in a manner consistent with the formation of p+ wells. Specifically, in one or more embodiments an n+ well is formed using a mask (e.g., photoresist layer) to define a well region in the substrate 602, implanting an n-type impurity or dopant (e.g., phosphorous) of a prescribed concentration level into the defined well region, and then performing a high-temperature anneal to drive the implanted impurity into the defined region of the substrate and thereby form the n+ well.

Figure 8:
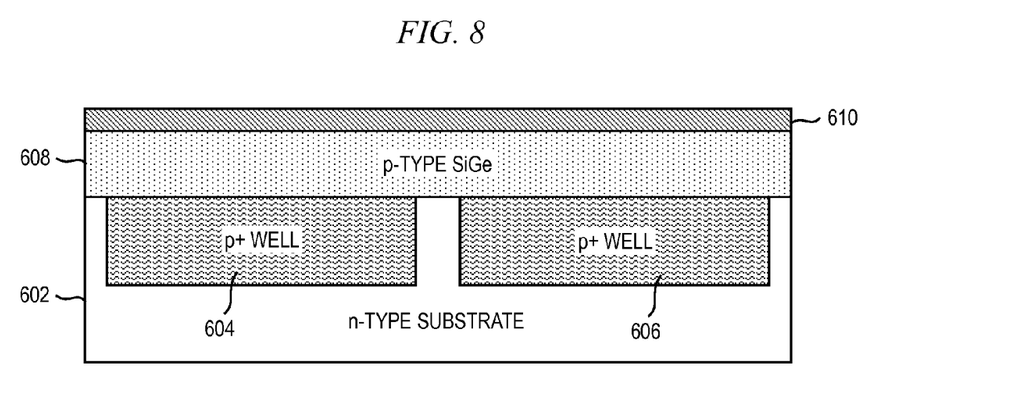

FIG. 8 depicts a p-type silicon-germanium (SiGe) layer 608 formed on at least a portion of the substrate 602, over the p+ wells 604, 606. The SiGe layer 608 will be used to form an intrinsic base of the two lateral BJT devices. SiGe layer 608 can be formed, for example, by an epitaxial growth or deposition process. A doping concentration of the p-type SiGe layer 608, in one or more embodiments, is less compared to a doping concentration of the p+ wells 604, 606. A hard mask layer 610 is then formed on at least a portion of the SiGe layer 608 for patterning defined portions of the SiGe layer 608 in a subsequent photolithographic process. In one or more embodiments, the hard mask layer 610 is formed of silicon nitride which is deposited on an upper surface of the SiGe layer 608 using, for example, chemical vapor deposition (CVD), although other materials and processes for forming the hard mask layer are similarly contemplated by, and within the scope of, embodiments of the invention.

Figure 9:
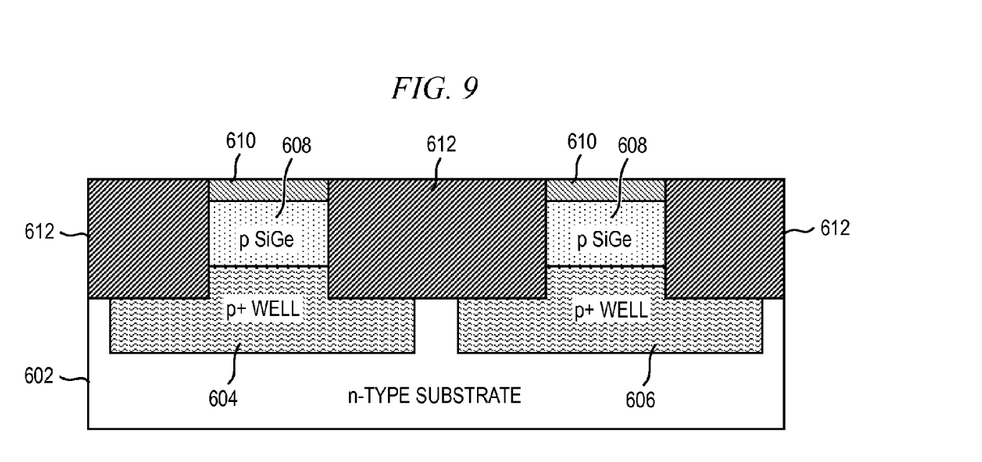

With reference to FIG. 9, shallow trench isolation (STI) regions 612 are formed. Although not explicitly shown, during the STI process, a pattern of trenches is etched, as defined by exposed portions of the hard mask layer 610, through the SiGe layer 608 and partially into the underlying p+ wells 604 and 606. One or more dielectric materials (e.g., silicon dioxide) are deposited, such as, for example, by chemical vapor deposition (CVD), to fill the trenches, and the excess dielectric material is removed using a planarization technique such as, for example, chemical-mechanical polishing (CMP). The STI regions 612 will provide electrical isolation between adjacent lateral BJT devices formed on the common substrate 602. In alternative embodiments, other methods of electrically isolating the lateral transistors may be used.

Figure 10:
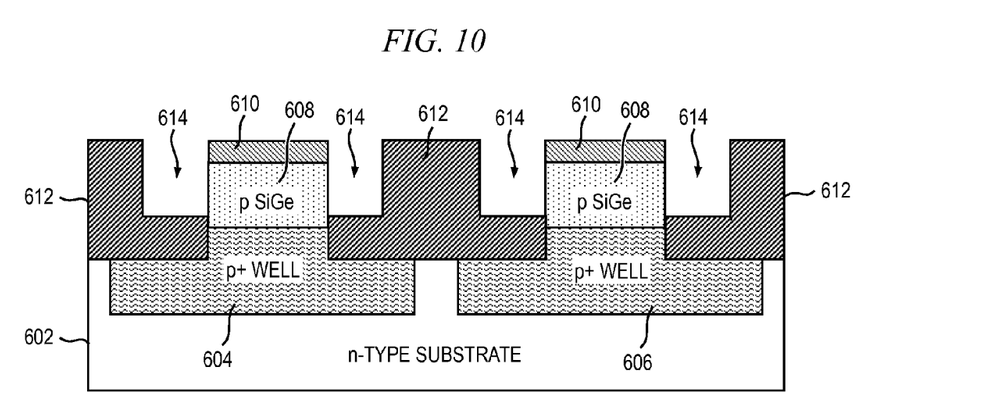
Figure 11:
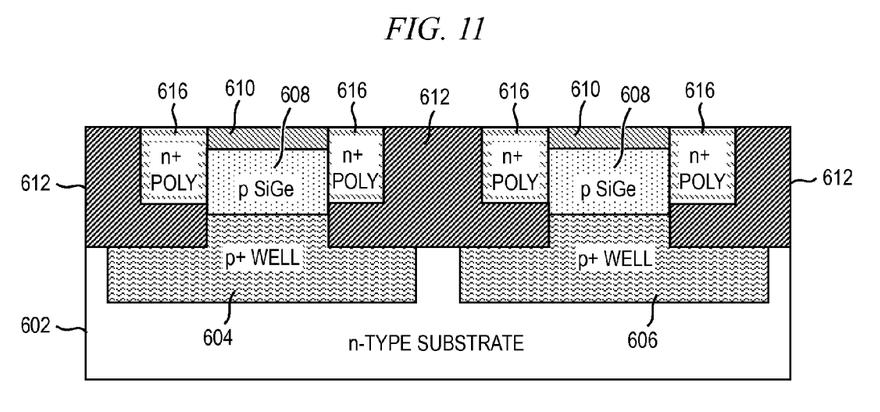

Next, the STI regions 612 are partially recessed where emitters and collectors of the respective lateral BJT devices are to be formed. More particularly, as shown in FIG. 10, the STI regions 612 are partially etched to form openings 614 partially through the STI regions. The openings 614 formed above at least a portion of the p+ wells 604, 606 and are adjacent to exposed sidewalls of the p-type SiGe layer 608, so that when the openings are filled with n+ type doped polysilicon material 616, as depicted in FIG. 11, P-N junctions are formed. The n+ polysilicon material 616 is deposited in the openings 614 (e.g., using a deposition process, such as CVD), in one or more embodiments, followed by CMP planarization, to form the emitters and collectors of the lateral BJT devices, as previously stated.

Figure 12:
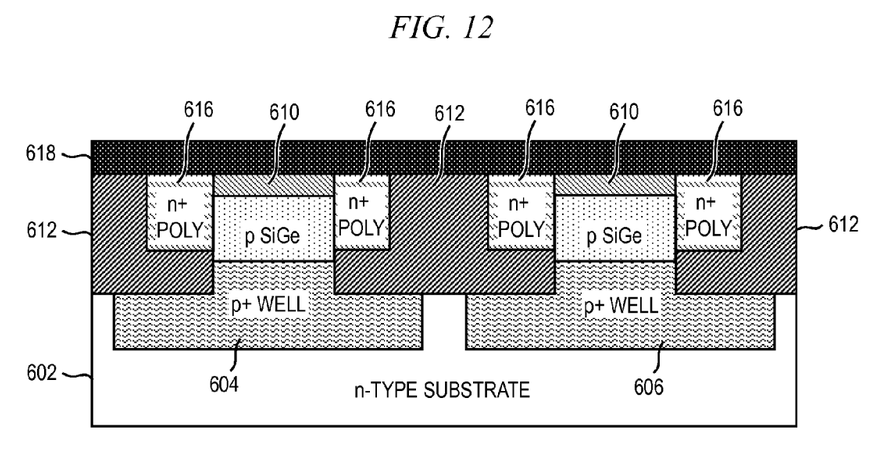

In FIG. 12, a passivation layer 618 is formed on an upper surface of the integrated circuit structure, over at least portions of the STI regions 612, the n+ type doped polysilicon material 616 and the remaining portions of the hard mask layer 610. The passivation layer 618 is formed to protect integrated circuit elements formed on the substrate 602 from subsequent processing steps. In some embodiments, the passivation layer 618 is formed of nitride, oxide, oxynitride, silicon dioxide, polymer (e.g., polyimide or polybenzoxazole), or other dielectric materials. In some embodiments, passivation layer 618 comprises a combination of dielectric materials. In one or more embodiments, additional passivation layers are formed over interconnect structures (not explicitly shown, but implied). In one or more embodiments, the passivation layer 618 has a thickness in a range from about 3,000 Angstroms (Å) to about 15,000 Å, although embodiments of the invention are not limited to any particular thickness of the passivation layer. In one or more embodiments, the passivation layer 618 is formed using methods such as, but not limited to, CVD, plasma-enhanced CVD (PECVD), spin-on, and other applicable methods known by those skilled in the art.

Figure 13:
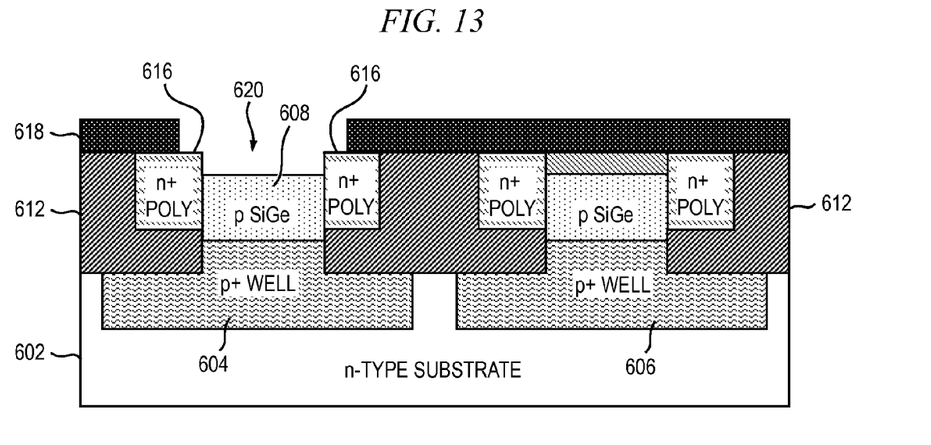

With reference now to FIG. 13, a base region of the sensing BJT device is exposed. Specifically, an opening 620 is formed, such as by etching a defined portion of the passivation layer 618 (e.g., using photolithography), followed by stripping of the hard mask layer 610 over the intrinsic base region 608 of the sensing BJT device, such as by etching (e.g., reactive ion etching or wet etching), to thereby expose the base region as well as portions of the n+ polysilicon emitter and collector (616) of the sensing BJT adjacent to the base region.

Figure 14:
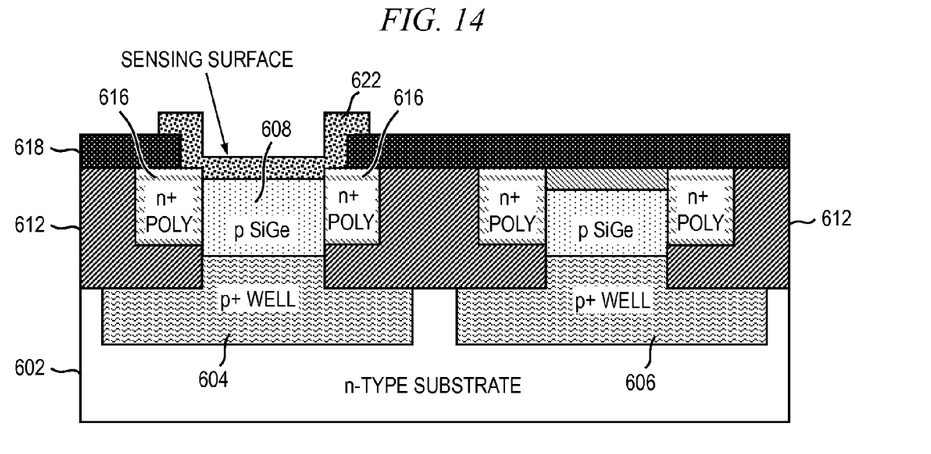

A sensing layer 622 is then formed on the exposed intrinsic base region 608 of the sensing BJT device, as shown in FIG. 14. The sensing layer 622, in one or more embodiments, comprises an insulating layer. The sensing layer 622 is depicted as being contact with the base and portions of the emitter and collector of the sensing BJT; there is no detrimental effect with the sensing layer being in contact with the emitter, base and collector regions when the sensing layer is an insulating layer. In one or more embodiments, the sensing layer 622 comprises a high-dielectric constant (high-k) insulating material, such as, for example, hafnium oxide ($HfO_2$), tantalum oxide ($Ta_2O_5$), or dual-layer silicon dioxide ($SiO_2$)/high-k film. The sensing layer 622, in one or more embodiments, may alternative comprise a multi-layer thin-film structure including at least one insulator layer and at least one metal layer, with the metal layer being in contact with the environmental condition/material being sensed and the insulating layer being in direct contact with the intrinsic base region 608 of the sensing BJT device. The metal layer of the dual-layer insulator/metal sensing layer 622, in one or more embodiments, can be, for example, titanium nitride (TiN), gold, tungsten, platinum, or the like, and the insulating layer can be, for example, silicon nitride, silicon dioxide, nitride, or the like. The sensing layer 622 is formed, in one or more embodiments, using a deposition technique, such as, for example, atomic layer deposition (ALD), CVD, sputtering, or the like, although other methods of forming the sensing layer are similarly contemplated.

Figure 15:
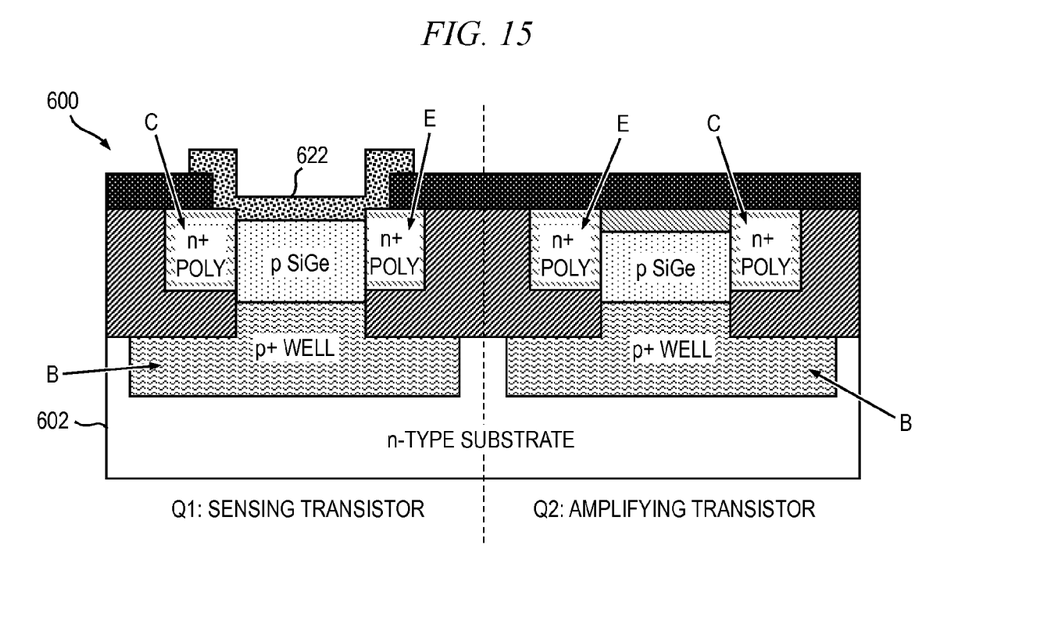

FIG. 15 depicts at least a portion of an exemplary completed sensor 600, according to an embodiment of the invention. The sensor 600 is shown with labels indicating bases, collectors and emitters of the respective lateral BJT devices included in the sensor; namely, sensing transistor Q1 and amplifying transistor Q2. Omitted from FIG. 15, merely for economy of description, are base, collector and emitter terminal connections for each of the transistors. Such terminal connections, as well as a local interconnect layer, are conventionally formed using a metal formation step, as will be known by those skilled in the art.

By using an oxide as the sensing layer 622, superior charge retention is achieved. As previously stated, the sensor 600 can be readily configured for a particular sensing application/environment (e.g., radiation, biological, chemical, etc.) through appropriate structure and/or material engineering of the sensing layer 622. That is, by changing the material or dimensions used to form the sensing layer 622, the sensing transistor Q1 can be customized for sensing a desired environmental condition and/or material. For example, for detecting charges created by ionizing radiation, suitable materials for the sensing layer 622 include, but are not limited to, $SiO_2$, SiN, SiON (silicon oxynitride), BN (boron nitride), $Al_2O_3$, $HfO_2$ (hafnium oxide), and $^{10}B$, $^{6}Li$, $^{3}He$, $^{157}Gd$ (neutron conversion layer for neutron detection). Likewise, for detecting other environmental changes such as pH and bio-molecules, exemplary sensing layers include, but are not limited to, TiN (titanium nitride), Au (gold), or dielectric materials (e.g., $SiO_2$, SiN, SiON, BN, $Al_2O_3$, $HfO_2$), with the surfaces functionalized by coating of a corresponding antibody (such as biotin) that specifically binds proteins of interest. Particular non-limiting examples include $SiO_2/HfO_2$ for detecting pH with $HfO_2$ on contact with solution, $HfO_2$ surface functionalized with biotin for detecting proteins such as streptrivdin, $SiO_2$/Au for detecting DNA and proteins using thiol chemistry, and $SiO_2$/Ag/AgCl with AgCl (silver chloride) in contact with solution for chlorine ion (Cl—) sensing.

Moreover, the gain of the amplifying transistor Q2, which affects the level of amplification of the sensing signal, can be controlled via material/device engineering. For instance, the gain of the amplifying transistor is controlled, in one or more embodiments, by controlling a doping ratio between the emitter and base of the amplifying transistor Q2. The emitter and collector regions are typically doped quite heavily, with doping concentrations above $1\times10^{20}$ per $cm^3$. The doping concentration of the intrinsic base region can be also varied according to desired device characteristics. By way of example only and without limitation, by decreasing the intrinsic base doping concentration of transistor Q2 from about $5\times10^{18}$ per $cm^3$ to $1\times10^{18}$ per $cm^3$, the current gain of transistor Q2 is increased by a factor of five.

In FIGS. 14 and 15, the hard mask layer 610 remains on the intrinsic base of the amplifying BJT Q2, under the passivation layer 618. While this layer can be stripped off prior to passivation, it is to be appreciated that whether the hard mask on the intrinsic base of Q2 is stripped or not essentially has no effect on device operation as long as the passivation layer 618, when in direct contact with the intrinsic base, does not introduce defects at the interface between the intrinsic base and the passivation layer.

Given the discussion thus far, it will be appreciated that, in general terms, an exemplary integrated sensor for detecting the presence of an environmental material and/or condition, according to an aspect of the invention, includes a sensing layer and first and second bipolar junction transistors (BJTs). The first BJT has a base that is electrically coupled with the sensing layer and is configured to generate an output signal indicative of a change in stored charge in the sensing layer. The second BJT is configured to amplify the output signal of the first bipolar junction transistor. The first and second BJTs are laterally adjacent to one another and formed a common substrate.

Given the discussion thus far, it will also be appreciated that an exemplary method for detecting the presence of an environmental material and/or condition includes the steps of: forming a sensing structure; forming a first bipolar junction transistor having a base that is electrically coupled with the sensing structure, the first bipolar junction transistor being configured to generate an output signal indicative of a change in stored charge in the sensing structure resulting from the presence of at least one of said environmental material and said environmental condition; and forming a second bipolar junction transistor configured to amplify the output signal of the first bipolar junction transistor, the first and second bipolar junction transistors being formed adjacent to one another on a common substrate.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more embodiments of the invention.

An integrated circuit in accordance with aspects of the present disclosure can be employed in essentially any application and/or electronic system involving sensors that can detect and provide relevant environmental information, such as, but not limited to, radiation levels, inorganic particles, biological and/or chemical entities, etc. Suitable systems for implementing embodiments of the invention may include, but are not limited to, personal radiation dosimeters, biosensors, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An integrated sensor, comprising:
    a sensing structure;
    a first bipolar junction transistor having a base that is electrically coupled with the sensing structure, the first bipolar junction transistor being configured to generate an output signal indicative of a change in stored charge in the sensing structure resulting from a presence of an environmental property; and
    a second bipolar junction transistor, the second bipolar junction transistor being configured to amplify the output signal of the first bipolar junction transistor;
    wherein the first and second bipolar junction transistors and the sensing structure are monolithically formed on a common substrate;
    wherein each of said first and second bipolar junction transistors comprises an inverted lateral bipolar junction transistor having an extrinsic base region formed underneath an intrinsic base thereof, the extrinsic base region having a higher doping concentration than the substrate.

2. The sensor of claim 1, wherein the sensing structure comprises an insulating layer positioned on and contacting an intrinsic base of said first bipolar junction transistor.

3. The sensor of claim 1, wherein the sensing structure comprises at least one insulating layer and at least one metal layer, the insulating layer being positioned on and contacting an intrinsic base of said first bipolar junction transistor and the metal layer being positioned on an upper surface of the insulating layer.

4. The sensor of claim 1, wherein the substrate is of a first conductivity type and the extrinsic base region comprises a well of a second conductivity type formed in the substrate, the well having a higher doping concentration than the substrate, and wherein the intrinsic base comprises a region of the second conductivity type formed on at least a portion of the well and being electrically coupled with the well, the intrinsic base having a lower doping concentration than the well.

5. The sensor of claim 4, wherein the substrate is an n-type substrate, the well is a p+ well, and the intrinsic base comprises a p-type silicon-germanium layer.

6. The sensor of claim 1, wherein at least the second bipolar junction transistor comprises a heterojunction bipolar transistor.

7. The sensor of claim 1, wherein a gain of the second bipolar junction transistor is controlled by controlling a doping ratio between an emitter and a base of the second bipolar junction transistor.

8. The sensor of claim 1, wherein the first and second bipolar junction transistors are laterally adjacent to one another and electrically isolated by a shallow trench isolation region formed therebetween.

9. The sensor of claim 1, wherein the sensing structure comprises at least one of hafnium oxide ($HfO_2$), tantalum oxide ($Ta_2O_5$), and a dual-layer silicon dioxide ($SiO_2$)/high-dielectric constant film.

10. The sensor of claim 1, wherein a current generated by an emitter of the first bipolar junction transistor is fed directly into a base of the second bipolar junction transistor, the output signal of the sensor being generated at a collector of the second bipolar junction transistor.

11. A method of forming a sensor for detecting a presence of at least one of an environmental material and an environmental condition, the method comprising steps of:
   forming a sensing structure on a semiconductor substrate;
   forming a first bipolar junction transistor on said substrate, the first bipolar junction transistor having a base that is electrically coupled with the sensing structure, the first bipolar junction transistor being configured to generate an output signal indicative of a change in stored charge in the sensing structure resulting from the presence of at least one of said environmental material and said environmental condition; and
   forming a second bipolar junction transistor on said substrate, the second bipolar junction transistor being configured to amplify the output signal of the first bipolar junction transistor, the first and second bipolar junction transistors being formed adjacent to one another on the substrate;
   wherein each of said first and second bipolar junction transistors comprises an inverted lateral bipolar junction transistor having an extrinsic base region formed underneath an intrinsic base thereof, the extrinsic base region having a higher doping concentration than the substrate.

12. A method of forming a sensor for detecting a presence of at least one of an environmental material and an environmental condition, the method comprising steps of:
   forming a sensing structure on a semiconductor substrate;
   forming a first bipolar junction transistor on said substrate, the first bipolar junction transistor having a base that is electrically coupled with the sensing structure, the first bipolar junction transistor being configured to generate an output signal indicative of a change in stored charge in the sensing structure resulting from the presence of at least one of said environmental material and said environmental condition; and
   forming a second bipolar junction transistor on said substrate, the second bipolar junction transistor being configured to amplify the output signal of the first bipolar junction transistor, the first and second bipolar junction transistors being formed adjacent to one another on the substrate;
   wherein forming a given one of said first and second bipolar junction transistors comprises:
      forming a well of a first conductivity type in the substrate, the substrate being of a second conductivity type, said well forming an extrinsic base;
      forming a region of the first conductivity type on at least a portion of the well and being electrically coupled with the well, the region of the first conductivity type forming an intrinsic base;
      forming shallow trench isolation (STI) regions above and at least partially into the underlying well;
      forming doped polysilicon regions of the second conductivity type in the STI regions proximate an upper surface of the STI regions, the doped polysilicon regions being spaced laterally from one another and being in electrical connection with the intrinsic base, the doped polysilicon regions respectively forming an emitter and a collector of the given one of the first and second bipolar junction transistors.

13. The method of claim 12, wherein the well is formed having a higher doping concentration than the substrate, and wherein the region of the first conductivity type is formed having a lower doping concentration than the well.

14. The method of claim 11, wherein forming said sensing structure comprises forming an insulating layer positioned on and contacting an intrinsic base of said first bipolar junction transistor.

15. The method of claim 11, wherein forming said sensing structure comprises forming at least one insulating layer and at least one metal layer, the insulating layer being positioned on and contacting an intrinsic base of said first bipolar junction transistor and the metal layer being positioned on an upper surface of the insulating layer.

16. The method of claim 11, further comprising controlling a gain of the second bipolar junction transistor by controlling a doping ratio between an emitter and a base of the second bipolar junction transistor.

17. The method of claim 11, further comprising configuring said sensing structure for a prescribed sensing application and environment by changing at least one of a material type and dimensions of the sensing structure.

18. The method of claim 11, further comprising forming a passivation layer on an upper surface of the sensor, the passivation layer having an opening formed above at least a portion of an intrinsic base of the first bipolar junction transistor, at least a portion of said sensing structure being formed in the opening of the passivation layer and electrically coupled with the intrinsic base of the first bipolar junction transistor.

* * * * *